United States Patent
Hurrell

(10) Patent No.: US 7,663,518 B2
(45) Date of Patent: Feb. 16, 2010

(54) DITHER TECHNIQUE FOR IMPROVING DYNAMIC NON-LINEARITY IN AN ANALOG TO DIGITAL CONVERTER, AND AN ANALOG TO DIGITAL CONVERTER HAVING IMPROVED DYNAMIC NON-LINEARITY

(75) Inventor: Christopher Peter Hurrell, Cookham (GB)

(73) Assignee: Analog Devices, Inc., Norwood, MA (US)

( * ) Notice: Subject to any disclaimer, the term of this patent is extended or adjusted under 35 U.S.C. 154(b) by 14 days.

(21) Appl. No.: 11/712,879

(22) Filed: Mar. 1, 2007

(65) Prior Publication Data

US 2008/0084340 A1 Apr. 10, 2008

Related U.S. Application Data

(60) Provisional application No. 60/850,530, filed on Oct. 10, 2006.

(51) Int. Cl.
*H03M 1/20* (2006.01)
(52) U.S. Cl. .................... 341/131; 341/155
(58) Field of Classification Search .......... 341/130–170
See application file for complete search history.

(56) References Cited

U.S. PATENT DOCUMENTS

| | | | |
|---|---|---|---|
| 5,010,339 A | 4/1991 | Giangano et al. | |
| 6,016,113 A * | 1/2000 | Binder | 341/131 |
| 6,172,629 B1 * | 1/2001 | Fetterman | 341/131 |
| 6,404,364 B1 * | 6/2002 | Fetterman et al. | 341/131 |
| 6,515,611 B1 * | 2/2003 | Fetterman et al. | 341/161 |
| 6,970,120 B1 * | 11/2005 | Bjornsen | 341/120 |
| 7,015,853 B1 * | 3/2006 | Wolff et al. | 341/155 |
| 7,215,267 B1 * | 5/2007 | Johnston | 341/131 |
| 7,250,080 B1 * | 7/2007 | Craig et al. | 106/445 |
| 7,250,880 B2 * | 7/2007 | Hurrell et al. | 341/155 |
| 7,274,321 B2 * | 9/2007 | Hurrell et al. | 341/156 |
| 7,286,075 B2 * | 10/2007 | Hennessy et al. | 341/172 |
| 7,317,411 B1 * | 1/2008 | Nanda et al. | 341/131 |

OTHER PUBLICATIONS

PCT/US2007/020744 international search report, Dec. 12, 2007.

\* cited by examiner

*Primary Examiner*—Lam T Mai
(74) *Attorney, Agent, or Firm*—Kenyon & Kenyon LLP

(57) ABSTRACT

An analog to digital converter comprising a conversion engine having redundancy therein; and a dither device for applying a dither to the conversion engine; and a controller adapted to operate the conversion engine to perform a successive approximation conversion of the analog input, and wherein the dither is removed prior to completion of the analog to digital conversion.

18 Claims, 6 Drawing Sheets

| Analog Input | Result | Error |
|---|---|---|
| | | (Analog Input - Result) |
| 9.9 | 8 | 1.9 |
| 9.7 | 8 | 1.7 |
| 9.5 | 8 | 1.5 |
| 9.3 | 8 | 1.3 |
| 9.1 | 8 | 1.1 |
| 8.9 | 7 | 1.9 |
| 8.7 | 7 | 1.7 |
| 8.5 | 7 | 1.5 |
| 8.3 | 7 | 1.3 |
| 8.1 | 7 | 1.1 |
| 7.9 | 7 | 0.9 |
| 7.7 | 7 | 0.7 |
| 7.5 | 7 | 0.5 |
| 7.3 | 7 | 0.3 |
| 7.1 | 7 | 0.1 |
| 6.9 | 6 | 0.9 |
| 6.7 | 6 | 0.7 |
| 6.5 | 6 | 0.5 |
| MSB actual weight 9 instead of 8 | | |

Fig. 3

| Analog Input | Result | Error |
|---|---|---|
| | | (Analog Input - Result) |
| 9.9 | 10 | -0.1 |
| 9.7 | 10 | -0.3 |
| 9.5 | 10 | -0.5 |
| 9.3 | 10 | -0.7 |
| 9.1 | 10 | -0.9 |
| 8.9 | 9 | -0.1 |
| 8.7 | 9 | -0.3 |
| 8.5 | 9 | -0.5 |
| 8.3 | 9 | -0.7 |
| 8.1 | 9 | -0.9 |
| 7.9 | 8 | -0.1 |
| 7.7 | 8 | -0.3 |
| 7.5 | 8 | -0.5 |
| 7.3 | 8 | -0.7 |
| 7.1 | 8 | -0.9 |
| 6.9 | 6 | 0.9 |
| 6.7 | 6 | 0.7 |
| 6.5 | 6 | 0.5 |
| MSB actual weight 7 instead of 8 | | |

Fig. 4

DITHER TECHNIQUE FOR IMPROVING DYNAMIC NON-LINEARITY IN AN ANALOG TO DIGITAL CONVERTER, AND AN ANALOG TO DIGITAL CONVERTER HAVING IMPROVED DYNAMIC NON-LINEARITY

FIELD OF THE INVENTION

The present invention relates to an analog to digital converter, and in particular to a converter using dither so as to improve dynamic non-linearity therein.

BACKGROUND OF THE INVENTION

It is desirable that an analog to digital converter should have a good resolution, but also exhibit good linearity. The resolution of a converter is quoted as the number of bits that it converts. Typically high performance analog to digital converters exhibit 14, 16 or 18 bit resolution. However a user should also pay attention to other performance metrics of the analog to digital converter, such as integral non-linearity, INL, and differential non-linearity, DNL. The differential non-linearity refers to the relative step sizes of each discrete code produced by the analog to digital converter. In an ideal world if a ramped input voltage is supplied to the analog to digital converter then each transition from one digital code to the next should be equally spaced along the analog input ramp. However differential non-linearity errors can result in these transitions becoming non-equally spaced. It can therefore be useful to think of the analog values as being sorted into different digital "bins" and therefore each bin should be the same size.

U.S. Pat. No. 5,010,339 teaches that DNL errors in converters can be greatly decreased, if not removed, by using a dithering technique. In this document a random offset is generated by a bi-polar digital to analog converter and is added in the analog domain to the input signal following its acquisition by a sample and hold circuit. This dithered input value is then sent to an analog to digital converter which converts the voltage obtained by combining the input voltage with the dither voltage. The analog to digital converter outputs a digital word to a further circuit which then subtracts the dither value from the digitised output word in order to produce the final result. The subtraction of the random offset from the conversion result requires additional digital hardware and also results in a delay from the end of the conversion period to when the corrected value, that is the value with the dither offset removed, can be presented. This technique is applicable for use in all types of analog to digital converter.

Adding a dither value to an analog value to be converted and then subtracting the digital equivalent of the dither value from the conversion result reduces DNL errors. The reduction in DNL errors is due to the conversion result being spread out over a number of codes. Steps in the transfer function of the analog to digital converter that would otherwise cause DNL errors at a particular code are "smeared" out over a number of codes.

SUMMARY OF THE INVENTION

According to a first aspect of the present invention there is provided an analog to digital converter comprising a conversion engine having redundancy therein and a dither device for applying a dither to the conversion engine and a controller adapted to operate the conversion engine to perform a successive approximation conversion of the analog input, and wherein the dither is removed prior to completion of the analog to digital conversion.

The inventor has realized that the delay caused by adding a further digital summer after the analog to digital converter so as to correct the ADC's output word to remove the dither, and the additional hardware footprint of the circuitry required to perform such post conversion processing in order to provide a correct result, can be avoided when using an analog to digital converter having redundancy. In order to achieve these advantages the inventor realized that the dither need only be applied during testing of some of the more significant bits of the conversion process and can then be removed whilst testing the less significant bits of the conversion process. Thus the overall number of bit trials performed by the analog to digital converter having redundancy remains unaltered and the output is immediately available from the converter without requiring a further processing overhead in order to account for the dither.

As used herein the term "redundancy" applies to analog to digital converters which include modifications to enable them to recover, at least partially, from an incorrect bit decision. One topology for a converter having redundancy is to change the weighting of the bit weights within the converter such that they are no longer binary weighted (radix=2) and to change them to a different relative weighting, such as radix=1.8. An alternative approach, and one favored by the applicant, is to include additional bits within the nominally weighted binary array such that some bit weights are repeated. Thus, working from the least significant bit to most significant bit rather than following the conventional binary weighted pattern of 1, 2, 4, 8, 16, 32, 64, 128 . . . and so on, the array may have a bit weight 1, 2, 4, 8, 8, 16, 32, 64, 128, 128, 256 . . . and so on. Thus it can be seen that some bit weights are repeated due to the provision of additional bits within the converter.

Advantageously the conversion array also includes "negative" bit weights which provide the capability to recover from an incorrect decision to keep a bit. Negative bit weights can be easily fabricated in switched capacitor technology merely by reversing the connections to the or each capacitor reference switches.

According to a second aspect of the present invention there is provided an analog to digital converter for outputting an N bit result, wherein a dither generator is used to apply a dither during bit trials prior to a Math bit (M<N) of the analog to digital conversion and is removed after the conversion of the Math bit, and wherein the converter includes sufficient redundancy therein to recover to a non-dithered value prior to the end of the conversion.

According to a third aspect of the present invention there is provided a method of operating an analog to digital converter comprising the steps of applying a dither value to an analog to digital converter having redundancy prior to conversion of a Math bit therein, and removing the dither for the conversion of the Math and subsequent bits, and wherein the analog to digital converter has sufficient redundancy to recover from the dither after the dither has been removed.

BRIEF DESCRIPTION OF THE DRAWINGS

Embodiments of the present invention will now be described, by way of non-limiting example only, with reference to the accompanying Figures in which:

FIG. 3 is a table comparing analog input value, result and error value in an example of a converter where the most significant bit has a weight of 9 instead of its nominal value of 8;

FIG. 4 is a table comparing analog input, digital result and error where the most significant bit has an actual weight of 7 instead of 8;

DESCRIPTION OF PREFERRED EMBODIMENTS OF THE INVENTION

Figure 1:
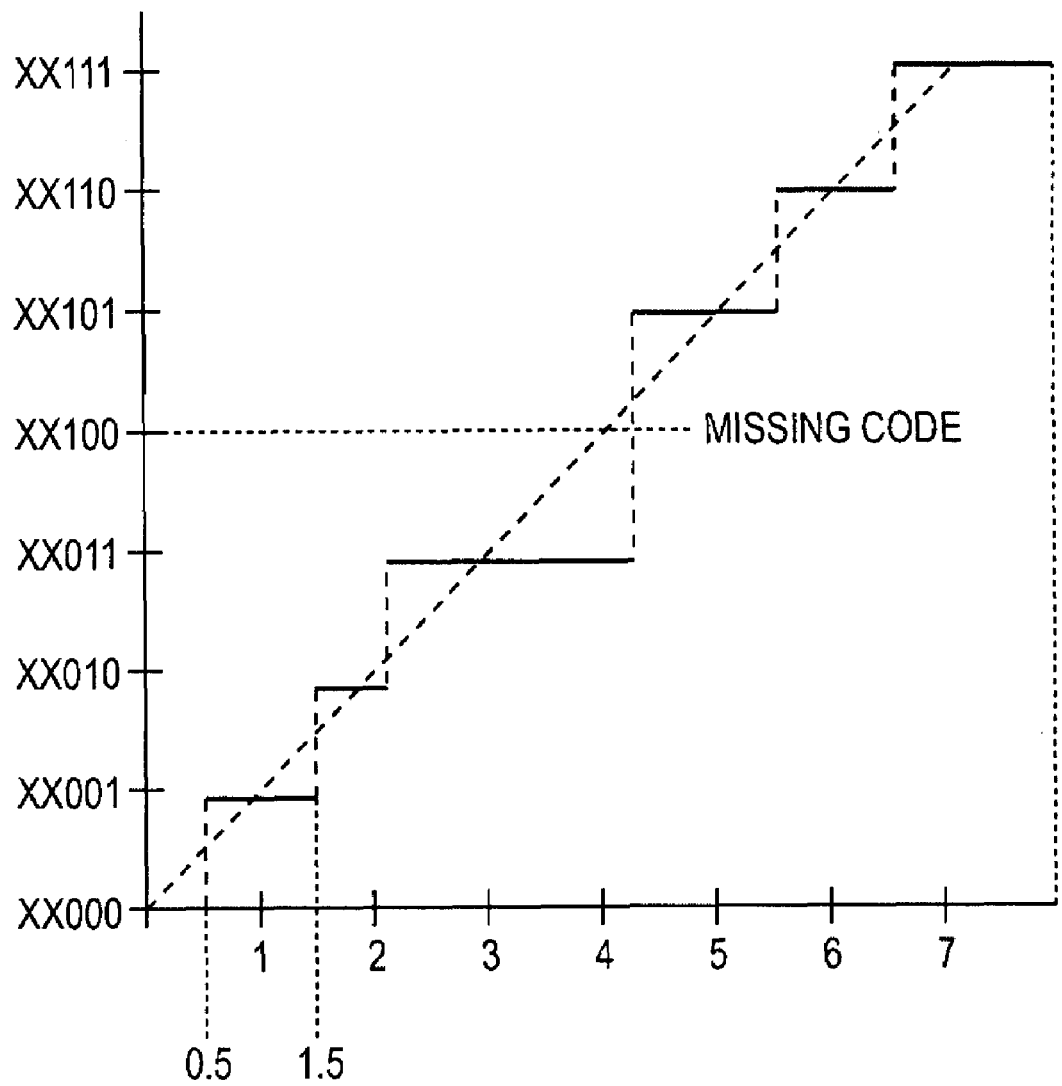
FIG. 1 schematically illustrates an example of differential non-linearity error in an analog to digital converter.

Ideally the transfer characteristic of an analog to digital converter should be linear. Therefore, as shown in FIG. 1 the digital code XX001 (where XX stands for preceding bits whose status is irrelevant to this discussion) spans an input voltage Vin from 0.5 to 1.5 arbitrary units. Similarly the arranged XX010 should span the input voltage range from 1.5 to 2.5 units. Each digital code should span the same distance in the analog domain, namely 1 voltage unit. However, as shown in FIG. 1 a DNL error occurs and consequently the code XX011 spans the input range from 2.25 to 4.25 units rather than 2.5 to 3.5 units as it should. This will mean that some values in the range Vin>1.5 and Vin<2.5 will be correctly converted as XX010 and some input values in that range will be converted incorrectly as XX011. In this example the code XX100 is missing and the code XX101 spans the range 4 to 5.5 units. The subsequent codes shown in FIG. 1 span their correct ranges.

Figure 2:
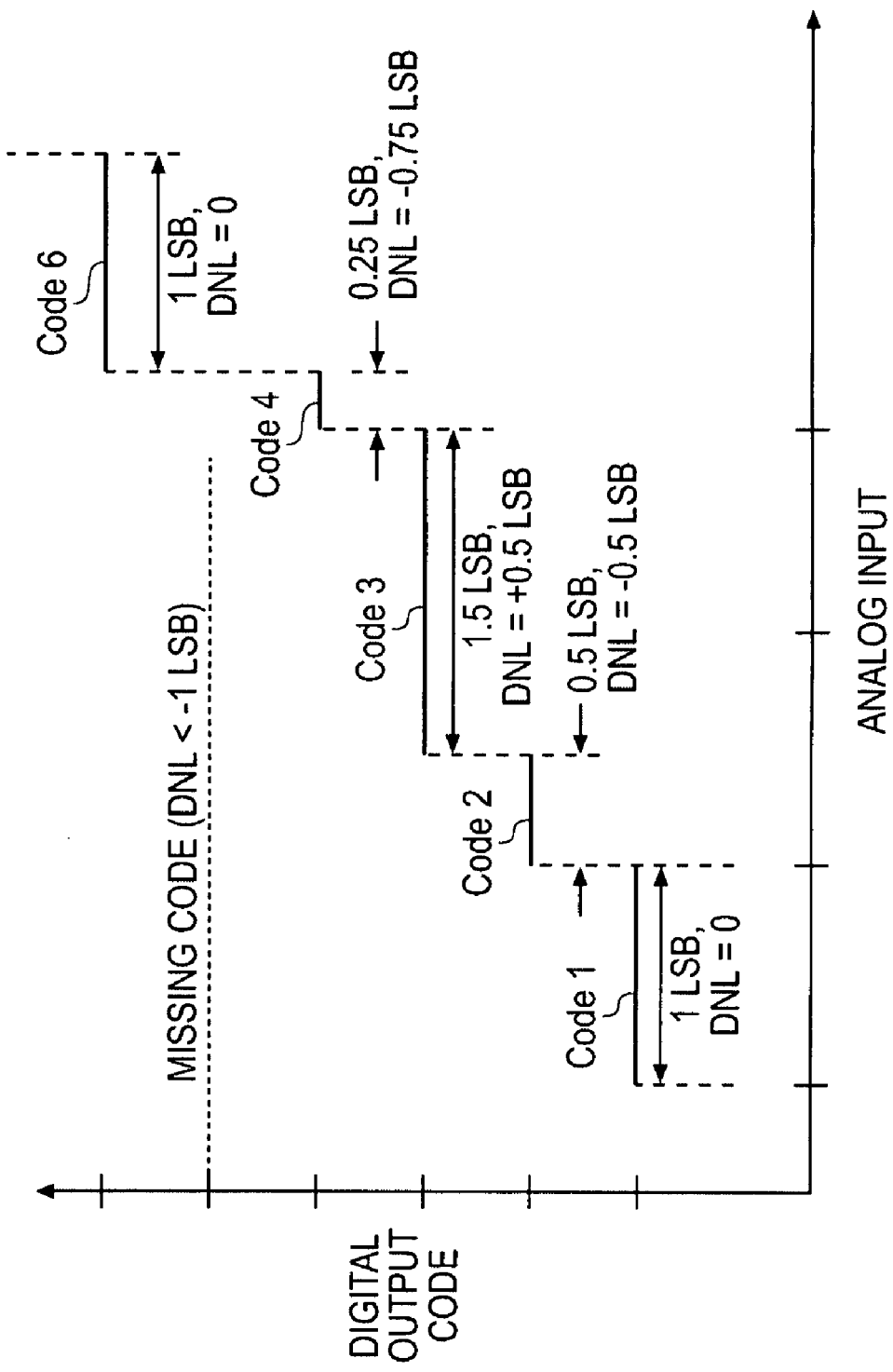
FIG. 2 is a diagram illustrating differential non-linearity errors.

When discussing DNL errors, it is useful to use a consistent nomenclature. This will be discussed with respect to FIG. 2. FIG. 2 shows a series of digital output codes versus analog input voltage. In this example the first output code, code 1, is assumed to exactly span its correct range of 1 LSB and consequently its DNL error is 0. The next code, code 2, only spans half the analog input range that it should span. Consequently it has a DNL error of −0.5 LSB. The third code, code 3, spans too great a range and in this example spans a range equivalent to 1.5 LSB so it has a DNL error of +0.5 LSB. The fourth code, code 4, only spans a range equivalent to 0.25 LSB and consequently has a DNL error of −0.75 LSB. The fifth code is missing, and consequently has a DNL error of −1 and the sixth code, code 6, spans the correct distance of 1 LSB so it has a DNL error=0 although it will be seen that this code is offset from its expected voltage range by 1.75 LSB.

Having defined a nomenclature for describing DNL errors, it is worth considering how they occur within a successive approximation routine, SAR, analog to digital converter. The successive approximation algorithm involves comparing a sampled analog value against a set of trial "weights" using an analog comparator. The largest weight is first compared (trialed) against the sampled value. If this weight is larger than the sampled analog value then it is rejected, but if it is less then it is kept. The next largest weight is then trialed in the same way and the process is repeated down from the largest weight to the smallest weight. The weights are conventionally binary weighted.

DNL errors arise due to manufacturing errors in the trial bit weights. In a SAR converter, the final result is the sum of the kept bit weights. For example, we may consider the case of a simple 4 bit converter where the ideal relative weightings between the bit weights will be 8, 4, 2 and 1. Now suppose that the most significant bit, which should have a weight of 8, actually has a weight of 9.0. If the analog value to be converted was 8.9 then the first would be rejected as the trialed actual weight of 9.0 is greater than the input value of 8.9. All the following bit weights would then be kept. The result of the conversion would then be 4+2+1=7. The ideal value for an input of 8.9 might, for this particular converter, be 8 so there would be an error of 1 LSB in the conversion result. FIG. 3 tabulates the conversion results and errors for a range of analog inputs where the LSB has an actual weight of 9. It can be seen that significant errors, greatly in excess of 1 LSB occur.

Below an analog input of 8, the error is in the range of 0 to 1, indicating a correct conversion. Above an input of 8 the error is in the range of 1 to 2. The fact that for evenly spaced inputs there are twice as many results of 7 indicates that the converter has a DNL error of 1 LSB at code 7.

FIG. 4 shows conversion results for the case where the most significant bit has a weight of 7 instead of 8. With an analog input of 6.9 the converter correctly gives a result of 6. With an analog input of 7.1 the MSB with the actual weight of 7 is kept giving a code of 8. Therefore it can be seen that code 7 is completely missing.

In order to achieve a completely missing code in the above example, a bit weight has to be in error by −1 LSB. For this to occur in the above MSB (nominally having a weight of 8) needs to be an error of 12.5%. For an LSB error to occur on the next bit, a bit weight error of 25% has to occur whereas for a −1 LSB error on bit 2 (having a nominal weight of 2) a 50% error in the bit weight is required. It can therefore be seen that errors capable of generating missing codes are much more likely to happen for the more significant bits than for the smaller less significant bits.

The inventor has realized that this observation can be used to improve the dither process applied to an analog to digital converter such that the dither is only applied during conversion of the most significant bits and consequently no subtraction of any random/dither value from the conversion result is required. This compares favourably with the prior art by eliminating the need to provide additional computational logic in order to perform the subtraction and also remove the time delay associated with the digital subtraction.

In embodiments of the present invention the analog input is offset or dithered by a random amount prior to or whilst performing conversion of some of the major, that is more significant, bit codes/bit weights. Once the bit trials that could cause unacceptable errors have been performed the dither is removed so that by the end of the conversion all of the numerical contribution of the dither to the final result has been removed while still having the effect of smearing out the critical decisions that may give rise to a DNL error. Thus there is no dither offset that needs to be subtracted from the conversion result at the end of the conversion, thereby avoiding the processing overhead of the prior art.

Subtracting or adding random offsets during a conversion in a conventional binary weighted converter will inevitably result in conversion errors. To avoid this some redundancy is needed in the bit weights to allow the converter to "recover" from the offset changes that are happening during the conversion. This redundancy can be achieved by using a radix less than 2 digital to analog converter or by the inclusion of one or more redundant bits. Redundant bits are usually bits that are additional to the normal binary weighted bits. For example, the highlighted bit in the series 8, 4, 2, 2, 1 is the redundant bit. A broader (but not necessarily a complete) definition of a DAC with redundancy is a DAC where the total weight or value of the bits adds up to more than $2^N-1$ where N is the number of bits in the final binary weighted output word. Thus, for a four bit DAC N=4, $2^N-1=15$ and therefore a converter where the bit weights add up to more than 15 would exhibit redundancy.

The minimum amount of redundancy required to accommodate the removal of the dither offset corresponds to the range of dither offset applied. For example, if the random dither offset values that are introduced before or during the early bit trials have values of 2, 1, and 0 then to remove the original dither offsets, corresponding offsets of −2, −1 or 0 will need to be added before the end of the conversion. For the converter to still achieve a correct result, a minimum of at least 2 LSBs of redundancy is required after the dither offset is removed. In a converter having bipolar dither the random dither offsets may be 2, 1, 0 and −1. Redundancy must then cover the range 2 to −1 which could be achieved with a redundant bit of weight +2 and a further redundant bit with a weight of −1.

It can be seen that the present invention only works with converters having redundancy and in such converters the bits do not directly correspond to the normal binary bits required at the output of the traditional binary weighted converter. As a result an adder is provided to add the bit weights of all the kept bits together so as to convert the output of the converter array to a binary weighted result.

In many converters redundancy is added to allow the converter to operate correctly with incomplete settling of the DAC. Digitally corrected converters also need redundancy to avoid DNL errors. The amount of redundancy required in many converters for these reasons or others may well exceed that required to recover from the offset change during the conversion in the proposed dither arrangement. As a result, it may well be that no additional redundancy is required to implement this new dither arrangement.

The dither may be generated by the use of a digital to analog converter, in association with a pseudo random generator which can be provided by a linear feedback shift register. Such a converter could couple into the main array of the analog to digital converter, such as into a switched capacitor array or, where the analog to digital converter array is segmented into a sub array thereof. However, when analog to digital converters are implemented using switched capacitor arrays, then the dither may be introduced directly into the array by modifying the control of the array. Dither may also be introduced directly at the comparator either by varying the comparator reference voltage in a single ended converter or by using a subsidiary input to the comparator so as to perturb the decision threshold of the comparator slightly. This technique, which is akin to using the offset compensation terminals which are sometimes provided in comparators, can be used with both single ended and differentially driven comparators.

Figure 5:
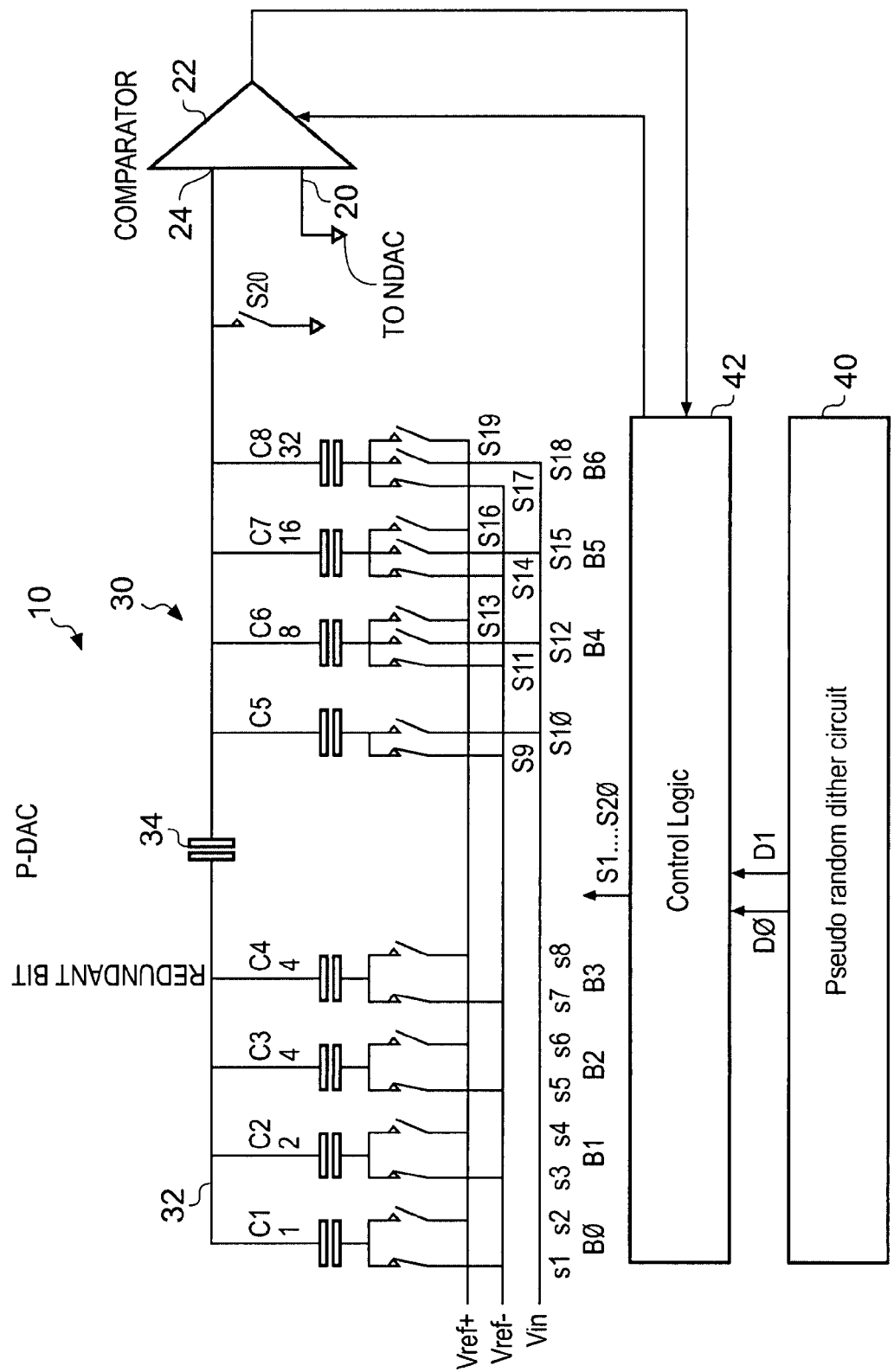
FIG. 5 is a circuit diagram schematically illustrating an analog to digital converter constituting a first embodiment of the present invention.

FIG. 5 schematically illustrates a simplified version of a switched capacitor digital to analog converter constituting an embodiment of the present invention. The analog to digital converter comprises a first switched capacitor array, generally designated 10, which acts as a digital to analog converter and which in accordance with the nomenclature used by the person skilled in the art, can be regarded as being a P-DAC. For a fully differential comparator an identical array may form a N-DAC and may be connected to an inverting input 20 of a comparator 22. The P-DAC 10 is connected to a non-inverting input 24 of the comparator 22.

The P-DAC 10 is, in this example, implemented as a segmented array comprising a primary array 30 and a sub array 32 connected to the primary array via a coupling capacitor 34. The sub array comprises capacitors C1 to C4 which have contributions of 1, 2, 4 and 4 arbitrary weights to the total weight of the array. Capacitors C6, C7 and C8 of the primary array have relative weights of 8, 16 and 32 arbitrary units respectively. The use of the sub array allows the relative scaling between the capacitors, for example C1 and C8 to be directly maintained without having to physically make C8 32 times bigger than C1. This technique is well known to the person skilled in the art and need not be described further. Each capacitor, C1 to C8 has two plates, which in the art are known as "top plates" and "bottom plates" where the top plates of C6, C7 and C8 connect directly to the comparator 22 whereas the top plates of capacitor C1 to C4 are also connected to the comparator 22 but this time via to coupling capacitor 34. The bottom plates of each of the capacitors C1 to C8 are connected via respective switches to either Vref+, Vref− or Vin. In this example the least significant bit is represented by capacitor C1 and switch S1 can be used to connect the bottom plate of C1 to Vref− whereas switch S2 can be used to connect the bottom plate of C1 to Vref+. Switches S1 and S2 are driven in anti-phase such that they are never both closed (conducting) at the same time. Similarly C2 representing the next least significant bit (B1) is associated with switches S3 and S4 and so on in the sub array. In the main array 30 things are slightly different, capacitor C5 is a so called "sampling capacitor" which is included merely to avoid gain errors introduced as a result of choosing to implement the switched capacitor array as a segmented array. Capacitors C6, C7 and C8 are used both to perform bit trials in the analog to digital conversion but also acts as sampling capacitors. Therefore C6 which represents bit 4 has three switches, namely switches S11, S12 and S13 associated with it. In this example S11 can be used to connect the bottom plate of C6 to Vref−, S13 can be used to connect the bottom plate of capacitor C6 to Vref+, and S12 can be used to connect the bottom plate of the capacitor C6 to Vin during sampling. Similar switches are provided in association with the capacitor C7 and C8.

During a sampling phase in a conventional converter, that is one not having dither, S12, S15 and S18 would be closed during the sampling, S11, S13, S14, S16, S17 and S19 would be open during sampling. Furthermore S1, S3, S5, S7 and S9 would be closed and S2, S4, S6, S8 would be open. Because a sampling capacitor is provided S10 would also be closed and S9 will be open. In this context closed means conducting and open means high impedance. During the sampling phase a further switch S20 would also be closed. Sampling is terminated by opening S20.

If the system designer determines, for example, that DNL errors of any significance are only likely to occur in relation to capacitors C6, C7 and C8, that is the most significant bit weights provided for within the main array 30, then a dither may be provided during the conversion of C6, C7, C8 corresponding to the bits B4, B5 and B6, or at least during the conversion of bit B4. Suppose that the designer chooses to add the dither for the conversion of bits B4, B5 and B6. In order to do this, after switch S20 is opened a pseudorandom dither circuit 40 generates a two bit dither word which is used to control the switches associated with capacitors C1 and C2. The dither word is passed to control logic 42 which controls the switch positions in a manner known to the person skilled in the art in order to perform the SAR conversion. The values from the dither circuit 40 modify the switch positions for C1 and C2 such that if dither bit D0 is set, then switch S2 is closed and switch S1 is opened and if dither bit D1 is set then switch S4 is closed and S3 is open. The changing of the switch states after the sampling phase has been completed causes the voltage occurring at the non-inverting input 24 of the comparator 22 to be modified slightly. The bit trials for bit B6, B5 and B4 are then performed in the normal way. After these bits have been determined, the switches in association with capacitors C1 and C2 are switched back to their normal states i.e. the bottom plates of C1 and C2 are switched back to Vref− such that the digital to analog conversion process can continue in the normal way. The remaining bit trials B0, B1, B2 and B3 are performed in the normal way and the final result is determined by adding the weights for the kept bits, including the redundant bit B3.

During this process the bit trials on bits B0 to B6 are performed in the conventional manner, i.e. the bit under trial, for example the most significant bit has its bottom plate temporarily connected to Vref+ and the voltage occurring at the non-inverting input 24 of the comparator is compared with that occurring at the inverting input and if the voltage at the non-inverting input 24 exceeds that at the inverting input then the bit is discarded otherwise it is kept. The next bit is then trialed with the status of any of the more significant bits being kept at the trial states determined by their own respective bit trails.

It can be seen that this arrangement allows the switched capacitor array to perform both the sampling, conversion and dither functions. Although the dither value was described as being held constant during the bit trials for the most significant bits, i.e. bit B4, B5 and B6, dither could in fact be varied during this phase. This allows for a further shifting of the critical decision thresholds and hence further smearing of these decisions with a subsequent improvements in the DNL error.

In the above example the dither is applied during the early bit trials by switching the dither capacitors from a fixed state during the acquire phase to a random state during the early bit trials. It is also possible to impose a dither on the early bit trials by setting the dither capacitors to their random state during the acquire phase and then switching them to a fixed state or conceivably further dither state or states during the early bit trials. The dither capacitors need then to be switched back to their original acquire dither state by the end of the conversion. This arrangement works because the required random offset or perturbation in the DAC voltage only occurs when the dither capacitors are switched away from their sampled dithered state during the early bit trials. By the end of the conversion the dither capacitors are back to their original state so the perturbation has been removed. In some embodiments selected capacitors can be set to the dithered state during the acquire phase and then be set to a fixed state or further dither state or states for the early bit trials then different capacitors could be used to remove the applied random offset in the DAC value by the end of the conversion. However these arrangements do not have the benefit of the embodiment shown in FIG. 5 where no additional capacitors are required to apply dither.

Figure 6:
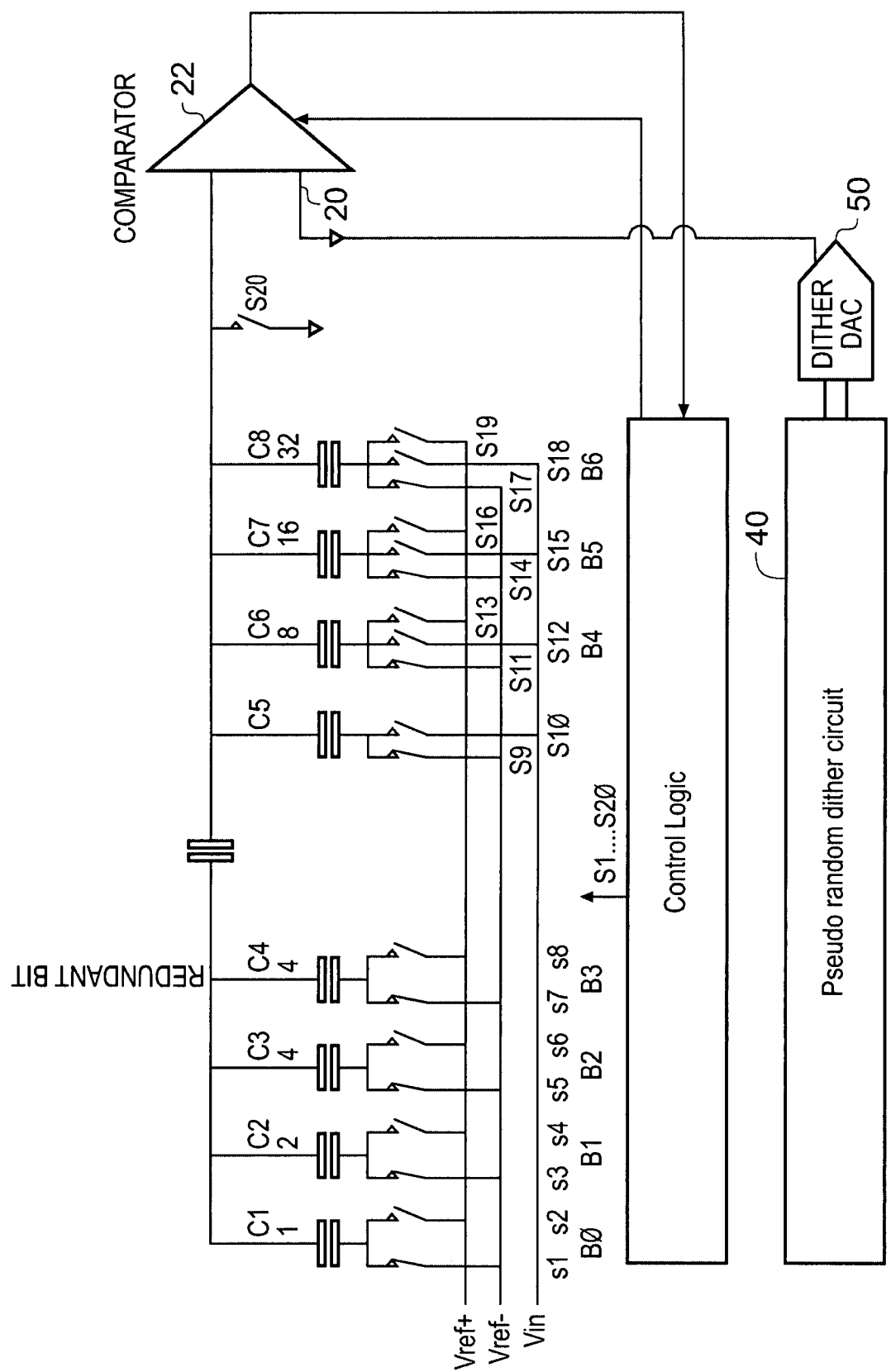
FIG. 6 is a schematic diagram of an analog to digital converter constituting a further embodiment of the present invention.

If, as shown in FIG. 6, the analog to digital converter is single ended, then it becomes possible to apply a perturbation direction to the voltage occurring at the inverting input 20 of the comparator 22. In such an arrangement an additional dither DAC 50 may be driven directly from the pseudorandom dither circuit 40. Alternatively, rather than using a digital domain device, the thermal noise across a component could be amplified and sampled and held to provide a truly random value to the inverting input 20 during the bit trials where the dither is required. The inverting input could then be connected to ground or Vref− for the remaining, less significant, bit trials. This might require the inclusion of bipolar redundancy which can be introduced by providing further redundant bits, for example further instances of C4 but optionally with different weights, where the default connection switches S7 and S8 are reversed compared to those for S7 and S8 shown in FIG. 6.

Although the invention has been described with respect to a low resolution converter for simplicity, it is applicable to higher resolution, e.g. 12, 14 and 16 bit converters. In for example a 12 bit converter the dither is applied during conversion of, say, the first 8 or 9 bits although this is at the discretion of the designer and the dither could be maintained for longer or be removed earlier.

It is thus possible to provide an analog to digital converter having improved DNL error without the expense of an increase in conversion time or the need to provide additional onboard circuitry in order to recalculate the output value in order to remove the digital equivalent of an analog dither value applied to the converter during the conversion process.

The invention claimed is:

1. An analog to digital converter comprising: an analog to digital converter, in which the conversion engine comprises a switched capacitor array having redundancy;
   a conversion engine comprising a switched capacitor array having redundancy therein;
   a dither device for applying a dither to the conversion engine; and
   a controller adapted to operate the conversion engine to perform a successive approximation conversion of an analog input, and wherein the dither is removed from the conversion engine prior to completion of successive approximation bit trials as part of the analog to digital conversion.

2. An analog to digital converter as claimed in claim 1, in which the switched capacitor array includes redundant bit weights.

3. An analog to digital converter as claimed in claim 2, in which the switched capacitor array includes positive and negative bit weights.

4. An analog to digital converter as claimed in claim 1, in which at least one capacitor of the switched capacitor array is used to apply dither.

5. An analog to digital converter as claimed in claim 4, in which the or each capacitor tat is used to apply the dither only applies the dither while a bit trial is testing a capacitor having a more significant weight than the capacitor providing the dither.

6. An analog to digital converter as claimed in claim 1, in which the dither is applied to the conversion engine after sampling of an analog input to be converted.

7. An analog to digital converter as claimed in claim 1, in which the dither is preset during sampling of an analog input to be converted.

8. An analog to digital converter as claimed in claim 1, in which the dither is varied between first and second non-zero values during the conversion.

9. An analog to digital converter as claimed in claim 1, in which the dither device includes a digital to analog converter for supplying the the dither to the conversion engine.

10. An analog to digital converter as claimed in claim 1, in which the dither is provided to a comparator of the conversion engine.

11. An analog to digital converter as claimed in claim 10, in which the dither is a random or pseudo random voltage applied to the comparator during testing of bit weights which have an equivalent value greater than the dither.

12. An analog to digital converter as claimed in claim 1, wherein a pseudo random or random dither is applied by the dither device only during conversion of a number of the more significant bits of the conversion process so as to improve a dynamic non-linearity of the analog to digital converter.

13. An analog to digital converter for outputting an N bit result, said converter comprising a dither generator which is used to apply a dither to the converter only during bit trials prior to a Mth bit (M<N) of a conversion, and wherein the converter includes sufficient redundancy therein to recover a conversion result to a value corresponding to that which would have resulted had a dither not been applied by the end of the conversion.

14. A method of operating an analog to digital converter comprising: steps of applying a dither to an analog to digital converter having redundancy prior to conversion of a Mth bit therein, and ceasing to apply the dither for the conversion of the Mth and subsequent bits, and wherein the analog to digital converter has sufficient redundancy to recover from the dither after the dither has been removed.

15. A method as claimed in claim 14, wherein the dither is applied by modifying the connections to at least one of the capacitors in a switched capacitor array during a sampling phase or a conversion of the more significant bits during the analog to digital conversion.

16. An analog to digital converter comprising:
a conversion engine comprising a switched capacitor array having redundancy therein;
a dither device including one or more capacitors for applying a dither to the conversion engine; and
a controller adapted to operate the conversion engine to perform a successive approximation conversion of an analog input, and wherein the dither is removed prior to completion of the analog to digital conversion, the conversion engine comprises a plurality of capacitors that form a switched capacitor array having redundancy, and the or each capacitor that is used to apply the dither only applies the dither while a bit trial is testing a capacitor having a more significant weight than the capacitor providing the dither.

17. An analog to digital converter comprising:
a conversion engine comprising a switched capacitor array having redundancy therein; and
a dither device for applying a dither to the conversion engine; and
a controller adapted to operate the conversion engine to perform a successive approximation conversion of an analog input, and wherein the dither is removed prior to completion of the analog to digital conversion, and wherein the dither is varied between first and second non-zero values during the conversion.

18. An analog to digital converter comprising:
a conversion engine comprising a switched capacitor array having redundancy therein;
a dither device for applying a dither to the conversion engine; and
a controller adapted to operate the conversion engine to perform a successive approximation conversion of an analog input, and wherein the dither is removed prior to completion of the analog to digital conversion, and in which the dither is provided to a comparator of the conversion engine.

* * * * *